United States Patent
Ramdane

(10) Patent No.: US 9,977,084 B2
(45) Date of Patent: May 22, 2018

(54) METHOD AND SYSTEM FOR DETERMINING CORE LOSSES IN A PERMANENT MAGNET SYNCHRONOUS MOTOR

(71) Applicant: Lateb Ramdane, Val de Reuil (FR)

(72) Inventor: Lateb Ramdane, Val de Reuil (FR)

(73) Assignee: SKF MAGNETIC MECHATRONICS, Saint-Marcel (FR)

(*) Notice: Subject to any disclaimer, the term of this patent is extended or adjusted under 35 U.S.C. 154(b) by 266 days.

(21) Appl. No.: 14/862,597

(22) Filed: Sep. 23, 2015

(65) Prior Publication Data

US 2016/0091569 A1 Mar. 31, 2016

(30) Foreign Application Priority Data

Sep. 26, 2014 (EP) .................................. 14306486

(51) Int. Cl.
*H02P 9/00* (2006.01)
*G01R 31/34* (2006.01)

(52) U.S. Cl.
CPC ................... *G01R 31/343* (2013.01)

(58) Field of Classification Search
None
See application file for complete search history.

(56) References Cited

U.S. PATENT DOCUMENTS

| | | | | |
|---|---|---|---|---|
| 7,952,318 B2* | 5/2011 | Lu | ............... | G01R 31/343 318/490 |
| 7,977,925 B2* | 7/2011 | Larsen | ............... | H02P 9/08 290/52 |
| 8,131,482 B2* | 3/2012 | Turner | ............... | H02P 23/14 702/33 |
| 8,203,298 B2* | 6/2012 | Lu | ............... | H02P 23/14 318/461 |
| 8,332,071 B2* | 12/2012 | Zeltzer | ............... | G05B 19/401 700/250 |
| 8,676,356 B2* | 3/2014 | Lu | ............... | H02P 23/0077 700/108 |
| 9,130,499 B2* | 9/2015 | Lu | ............... | G01P 3/48 |
| 9,170,303 B2* | 10/2015 | Lu | ............... | G01R 31/343 |
| 2001/0035730 A1* | 11/2001 | Yoshikawa | ............... | H02P 8/34 318/685 |
| 2005/0071095 A1* | 3/2005 | El-Ibiary | ............... | H02P 23/14 702/60 |
| 2007/0200528 A1 | 8/2007 | Itou et al. | | |

(Continued)

OTHER PUBLICATIONS

Alfio Consoli et al: "Interior Type Permanent Magnet Syncronous Motor Analysis by Equivalent Circuits," IEEE Transactions on Energy Conversion, Dec. 1, 1989, pp. 681-689.

(Continued)

*Primary Examiner* — Michael Lebentritt
(74) *Attorney, Agent, or Firm* — Bryan Peckjian; SKF USA Inc. Patent Dept.

(57) ABSTRACT

A method and system for determining core losses in a permanent magnet synchronous motor, comprising a measurement of the losses of the motor with the motor not connected to a load, and a deduction of the core losses of the motor from the losses of the motor. The motor is placed in an over-fluxing state during the measurement of the losses.

8 Claims, 5 Drawing Sheets

(56) References Cited

U.S. PATENT DOCUMENTS

2011/0133682 A1* 6/2011 Egger ..................... H02P 8/12
                                                                              318/685

OTHER PUBLICATIONS

Branz Lorenzo et al: "Analytical calculation of the no-load flux density in the stator core of the slotless SPM machines," 2013 International Conference—Wokrshop Compatibility and Power Electronics, IEEE, Jun. 5, 2013, pp. 244-249.

* cited by examiner

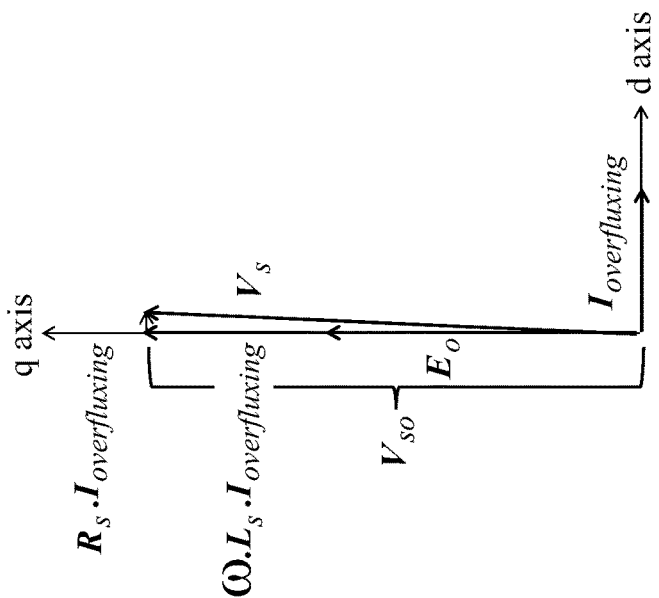
FIG. 4
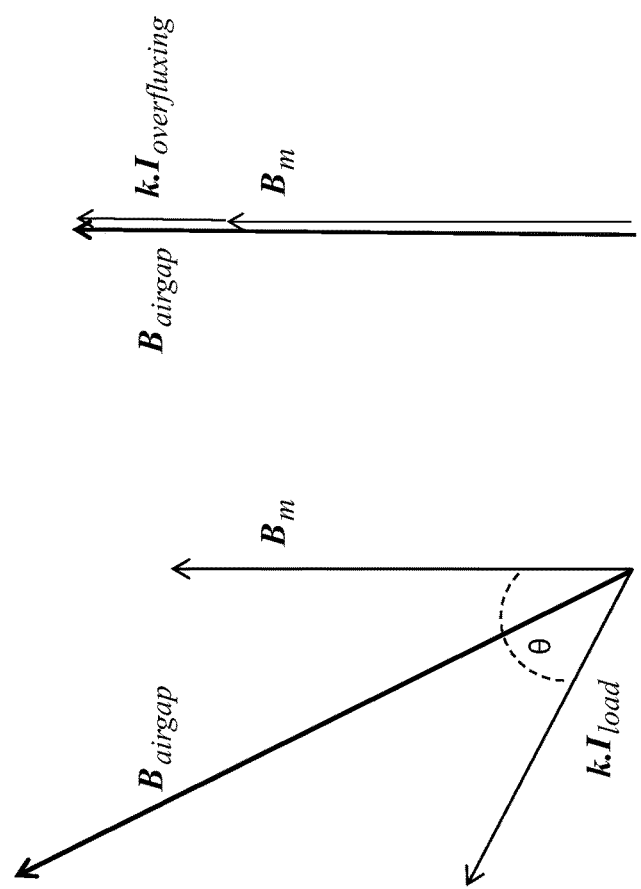
FIG. 3
FIG. 2

METHOD AND SYSTEM FOR DETERMINING CORE LOSSES IN A PERMANENT MAGNET SYNCHRONOUS MOTOR

CROSS REFERENCE TO RELATED APPLICATION

This is a Non-Provisional Patent Application, filed under the Paris Convention, claiming the benefit of Europe (EP) Patent Application Number 14306486.3, filed on 26 Sep. 2014 (26.09.2014), which is incorporated herein by reference in its entirety.

FIELD OF THE INVENTION

The present invention relates to permanent magnet synchronous motors, and more precisely to the determination of core losses in a permanent magnet machine synchronous motor.

DESCRIPTION OF THE RELATED ART

Permanent magnet machines and surface mounted permanent magnet synchronous motors are well suited for high speed applications, which require robust rotors.

New efficiency standards are likely to be applied to permanent magnet synchronous motors in the upcoming years. These standards require low levels of losses. By way of example, a new 1E5 Premium Efficiency European Standard could be applied to permanent magnet synchronous motors coupled with variable frequency drives.

It is therefore needed to determine the losses in a permanent magnet synchronous motor.

It has thus been proposed to directly test the motors in use, namely when the motors are connected to a load. These methods, frequently named direct methods and described in the IEC 60034-2, IEE 115 and NEMA standards, may not be suitable for mid to high power testing of high speed motors because of complexity issues and the expensiveness of power supplies and cooling equipment.

Indirect methods have also been proposed. Known methods include the segregated losses method. The IEC 60034-29 standard summarizes the various indirect testing methods for different motors (induction motors, DC motors and Synchronous motors).

It should be noted that these methods do not apply strictly to permanent magnet synchronous motors, but the retardation and short circuit methods of the IEC 60034-2 standard may still be used for the permanent magnet synchronous motors.

It has been observed that permanent magnet synchronous motors present a non-negligible armature reaction due to the high air-gap, more precisely due to the mechanical air-gap for cooling and the retaining sleeve. The estimation of core losses when no load is connected to the motor is consequently wrong using the methods of the prior art.

A method according to the prior art to determine core losses may comprise:
- A retardation or deceleration or coast-down test in vacuum and under different air pressure levels in order to deduce windage losses,
- A retardation or deceleration or coast-down test in vacuum and under different current biases in order to deduce the rotor active magnetic bearing losses,
- A retardation or deceleration or coast-down test under atmospheric pressure to deduce the total no-load losses,
- A deduction from the total no-load losses of the rotor active magnetic bearings losses and the windage losses.

The deduction step only provides a no-load value, which may be used with the following equation to obtain the core losses $P_{core}$ when a load is connected to the motor:

$$P_{Core} = \left(\frac{1}{R_{Eddy}} + \frac{1}{R_{Hyst} \cdot f}\right) \cdot V_{S0}^2$$

With $R_{Eddy}$ representing the quantity of Eddy currents, and $R_{Hyst}$ representing the hysteresis quantity, f the frequency of the motor, $V_{S0}$ the no-load back electromotive force.

According to the prior art, it is possible to use the frequency and electromotive force corresponding to a situation where a load is connected to obtain the core losses.

However, it has been observed that $R_{Eddy}$ and $R_{Hyst}$ vary with respect to the flux density level. This is caused by the armature reaction of permanent magnet synchronous motors. Consequently, the no-load core losses are useless to determine the full load core losses.

It is a primary object of the invention to provide methods and system that overcome the deficiencies of the currently available systems and methods.

SUMMARY OF THE INVENTION

The present invention overcomes one or more deficiencies of the prior art by proposing a method for determining core losses in a permanent magnet synchronous motor, comprising a measurement of the losses of the motor with the motor not connected to a load, and a deduction of the core losses of the motor from the losses of the motor.

According to a general aspect of the method, the motor is placed in an over-fluxing state during the measurement of the losses.

The inventors have observed that by placing a motor in an over-fluxing state, with the motor being in a no-load condition (not connected to a load), the flux density in the motor is close to the flux density of the motor connected to a load. The determination of the core losses therefore takes the armature reaction into account and is more accurate.

According to a specific embodiment, the method comprises placing a filter between the motor and an electric power supply, the filter being configured to supply reactive current to the motor.

By supplying reactive current to the motor, its magnetic state is close to the one of a motor connected to a load, and the remaining active currents that are consumed by the motor correspond to losses.

It is not required to use the above mentioned formula of the prior art because the obtained core losses are the same as the ones when the motor is connected to a load: there is no extrapolation.

According to a specific embodiment, the filter is a LC filter.

By simply adding an LC filter between a power supply and the motor, mainly reactive currents may be fed to the motor.

According to a specific embodiment, a direct component $I_{Overfluxing}$ of the current supplied to the motor for placing the motor in the over-fluxing condition obtained by the following equation:

$$I_{Overfluxing} = \sqrt{I_{load}^2 + \frac{B_m^2}{k^2} - 2 \cdot \frac{I_{load} \cdot B_{max}}{k} \cdot \cos(\pi - \theta)}$$

with $I_{load}$ being a current associated with a load, $B_m$ the flux density due to the magnets of the motor, k a geometrical coefficient, $B_{max}$ the maximum flux density of the motor and θ a phase shift.

According to a specific embodiment, the deduction of the core losses comprises a determination of at least one type of losses among copper losses, time harmonic losses, active magnetic bearing losses, windage losses, and Litz copper losses.

Again, it should be noted that it is not required to use the above-mentioned equation of the prior art to obtain the core losses, because they may be obtained from the total losses after the other losses have been subtracted.

The invention also proposes a system for determining core losses in a permanent magnet synchronous motor, comprising a measuring device for measuring the losses of the motor with the motor not connected to a load, and a feature for deducting the core losses of the motor from the losses of the motor.

According to a general aspect of the system, the system comprises motor operating controller for placing the motor in an over-fluxing state during the measurement of the losses.

According to a specific embodiment, the motor operating controller for placing the motor in an over-fluxing state comprise a filter between the motor and an electric power supply, the filter being configured to supply reactive current to the motor.

According to a specific embodiment, the filter is a LC filter.

According to a specific embodiment, a direct component $I_{Overfluxing}$ of the current supplied to the motor for placing the motor in the over-fluxing condition obtained by the following equation:

$$I_{Overfluxing} = \sqrt{I_{load}^2 + \frac{B_m^2}{k^2} - 2 \cdot \frac{I_{load} \cdot B_{max}}{k} \cdot \cos(\pi - \theta)}$$

with $I_{load}$ being a current associated with a load, $B_m$ the flux density due to the magnets of the motor, k a geometrical coefficient, $B_{max}$ the maximum flux density of the motor and θ a phase shift.

According to a specific embodiment, the measuring device for deducting the core losses of the motor comprise feature for determining at least one type of losses among copper losses, time harmonic losses, active magnetic bearing losses, windage losses, and Litz copper losses.

BRIEF DESCRIPTION OF THE DRAWINGS

How the present invention may be put into effect will now be described by way of example with reference to the appended drawings, in which:

FIG. 2 is a diagram of the flux in a motor connected to a load;
FIG. 3 is a diagram of the flux in an over-fluxing state;
FIG. 4 is a d-q diagram of the motor in an over-fluxing state.

DESCRIPTION OF THE EMBODIMENTS

Figure 1:
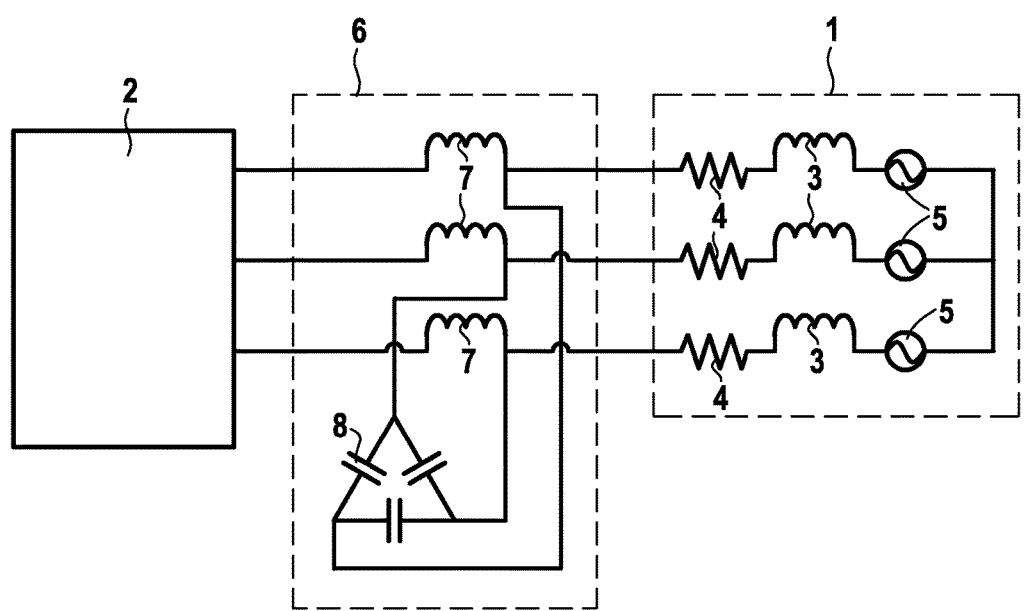
FIG. 1 is a schematic representation of an arrangement of a motor, a filter, and a power supply.

On FIG. 1, a permanent magnet synchronous motor 1 having three phases A, B and C has been represented. The motor 1 is a 300 kilowatt and 20500 revolutions per minute motor.

The motor 1 receives electrical power produce by an electric power supply 2, here a variable frequency drive. The electric power supply 2 provides current for the three phases A, B and C of the permanent magnet synchronous motor 1.

It should be noted that on FIG. 1, the motor 1 is not connected to a load and only its stator has been represented. For each phase A, B or C, the permanent magnet synchronous motor 1 has a winding 3 represented with its intrinsic resistor 4 and a voltage source 5 corresponding to the no-load electromotive force.

In order to place the permanent magnet synchronous motor 1 in an over-fluxing state, a filter 6 is placed between the motor 1 and the electric power supply 2. The filter 6 is configured to supply reactive current to the motor (without taking into account the parasitic resistors of the filter). In order to do so, the filter 6 is a LC filter comprising for each phase a self 7 connected in series between the electric power supply 2 and the motor 1, and a capacitor 8 having an electrode connected between the self 7 and the motor 1 and an electrode common to another capacitor.

In order to test the motor at least one power analyzer is connected to the motor. Preferably, two power analyzers are used for redundancy and in order to minimize the error in the measurement. The power analyzers may also measure the total harmonic distortion current, which may preferably be kept under 5% during the measurements.

Additional circuitry, software or other features may also be used to determine the total losses.

After the motor has been placed in an over-fluxing state, a deduction of the core losses may be carried on by determining all the other types of losses through methods known to the skilled man.

More precisely, the deduction of the core losses may comprise a determination of at least one type of losses among copper losses, time harmonic losses, active magnetic bearing losses, windage losses, and Litz copper losses.

FIGS. 2 to 4 will explain how the required level of current is obtained.

FIG. 2 is a diagram of the flux in a motor connected to a load, wherein the flux in the air-gap is represented by a vector $B_{airgap}$. When the motor is connected to a load, $B_{airgap}$ is the resultant of two components, the flux density due to the magnets of the motor $B_m$ and the armature reaction $k.I_{load}$. The direction of the resultant $B_{airgap}$ is determined by the working conditions of the motor and by the angle θ between $B_m$ and $k.I_{load}$.

By way of example, for maximum torque, $B_m$ and $k.I_{load}$ are in quadrature (θ=π/2).

When no load is connected or coupled to the motor, in order to obtain the same flux density level in the air-gap, the motor has to be placed in an over-fluxing state. This requires that the magnet flux density $B_m$ be collinear to the armature reaction flux density $k.I_{load}$ (FIG. 3).

The level of over-fluxing current, here its direct component, may then be deduced from the following equation:

$$I_{Overfluxing} = \sqrt{I_{load}^2 + \frac{B_m^2}{k^2} - 2 \cdot \frac{I_{load} \cdot B_{max}}{k} \cdot \cos(\pi - \theta)}$$

with $I_{load}$ being a current associated with a load, $B_m$ the flux density due to the magnets of the motor, k a geometrical coefficient, $B_{max}$ the maximum flux density of the motor and θ the phase shift.

The coefficient k is determined by notably taking into account the number of turns of the windings, the internal stator diameter, the length of the motor, the winding arrangements, the air-gap length.

It should be noted that $I_{Overfluxing}$ is lower than the corresponding load current with the motor connected to a load.

FIG. 4 is a d-q diagram (direct-quadrature diagram using Park's transformation) showing the motor in an over-fluxing state.

On this figure, $V_S$ is the motor voltage at the end box, and $E_0$ is the no-load electromotive force.

As can be seen on the figure, a small resistive voltage drop $R_S \, I_{Overfluxing}$ can be observed due to the resistive losses. These losses only correspond to the remaining active power that reaches the motor.

Figure 5:
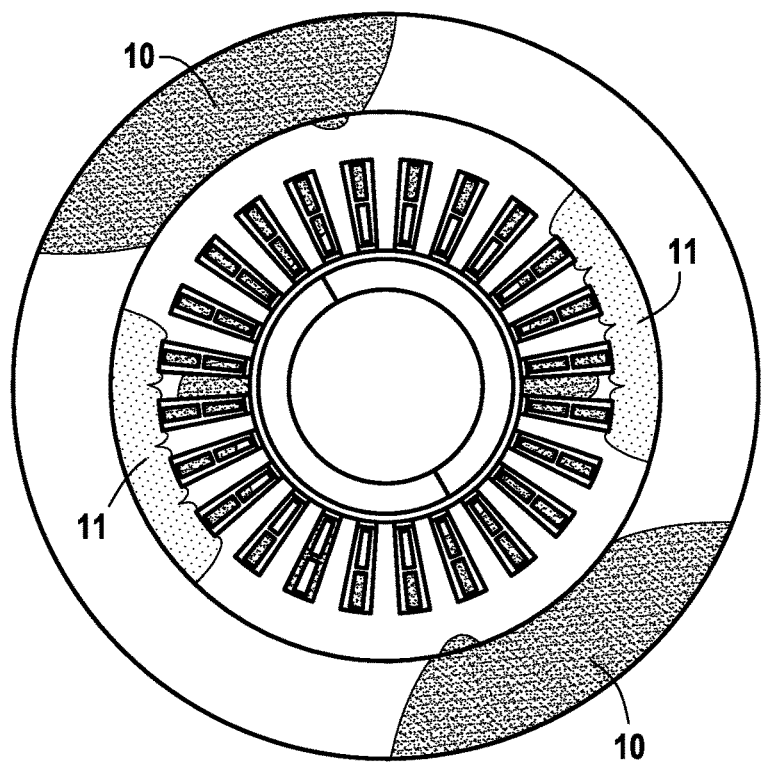
FIGS. 5 and 6 are representations of the flux density when the motor is connected to a load and when the motor is in an over-fluxing state.

FIG. 5 is a representation of the flux density in the motor connected to a load, with different shadings to highlight the level of flux density in teslas. On this figure, the dark areas 10 and 11 respectively correspond to highest levels of flux in the stator and in the air-gap.

Figure 6:
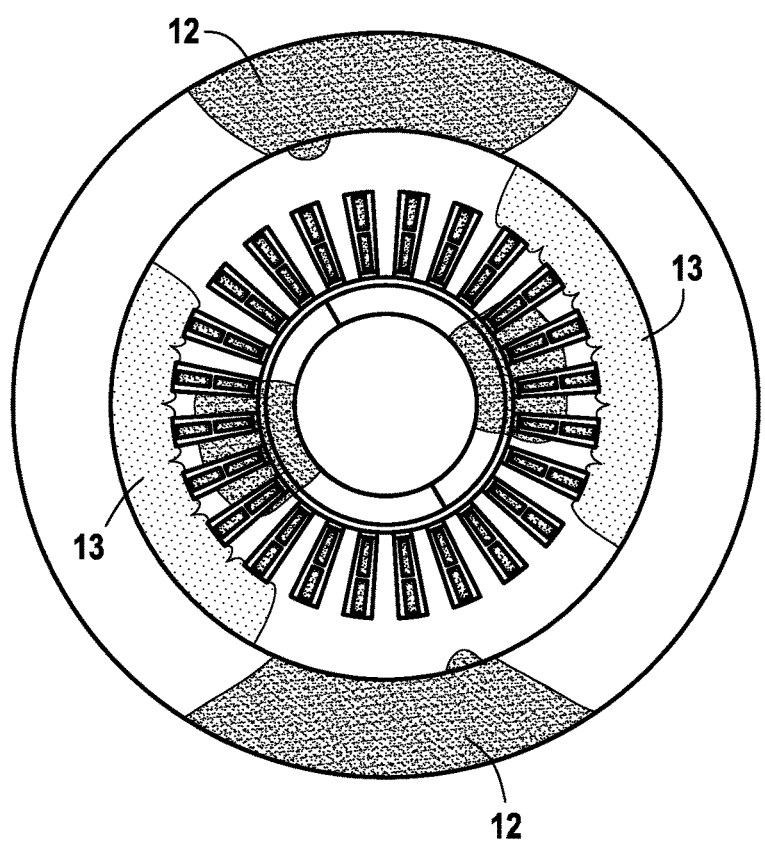

By placing a motor in an over-fluxing state, without connecting it to a load, a similar distribution of flux may be observed in the motor (FIG. 6). It should be noted that the two areas 12 and 13 in which the density is at its highest level are in quadrature.

Figure 7:
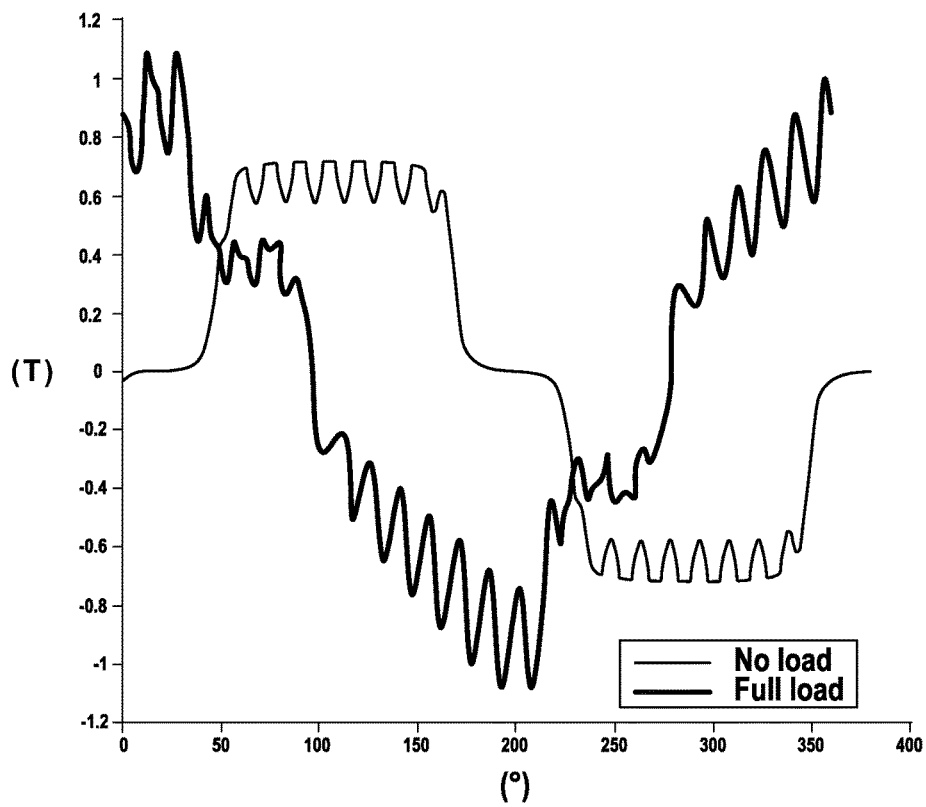
FIGS. 7 and 8 are diagrams of the flux density when a load is connected to a motor, when the motor is not connected to a load, and when the motor is placed in an over-fluxing state.
Figure 8:
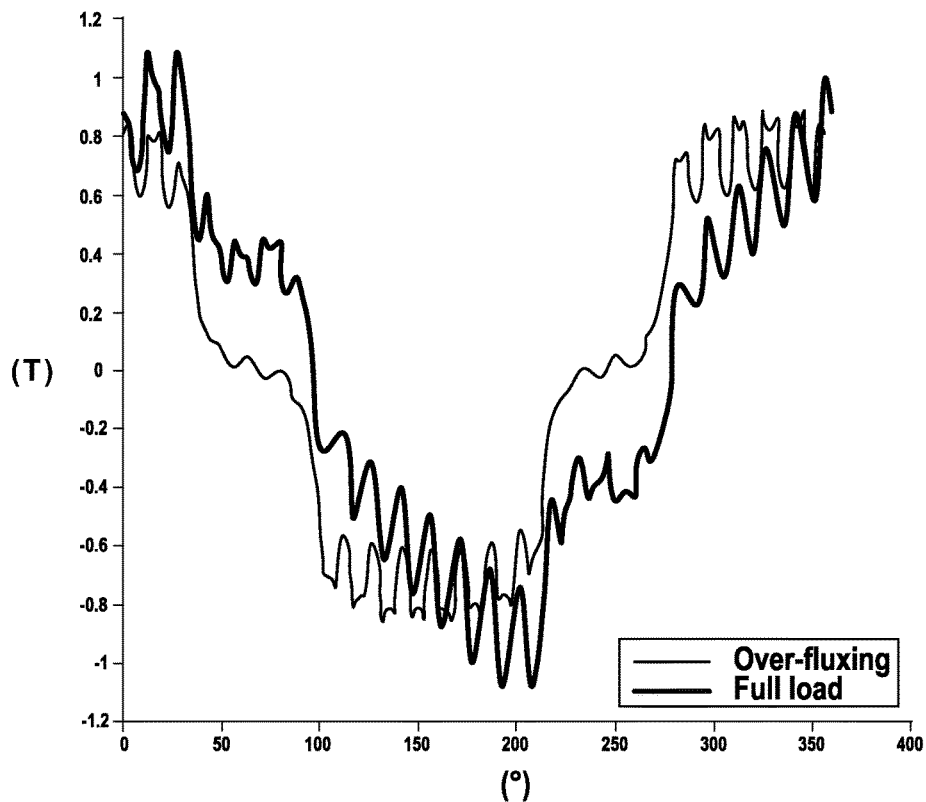

FIGS. 7 and 8 are diagrams showing the flux density $B_{airgap}$ along the air-gap (from 0 to 360°).

More precisely, on FIG. 7, the flux density $B_{airgap}$ of a motor not connected to a load and the flux density of a motor connected to a load are represented. As can be seen on this figure, the two flux densities differ.

On FIG. 8, the flux density $B_{airgap}$ of a motor in an over-fluxing state and of a motor connected to a load are represented. The two flux densities appear to be similar. A spectral analysis of the flux density may be used to confirm this similarity, especially for the lower space harmonics.

Figure 9:
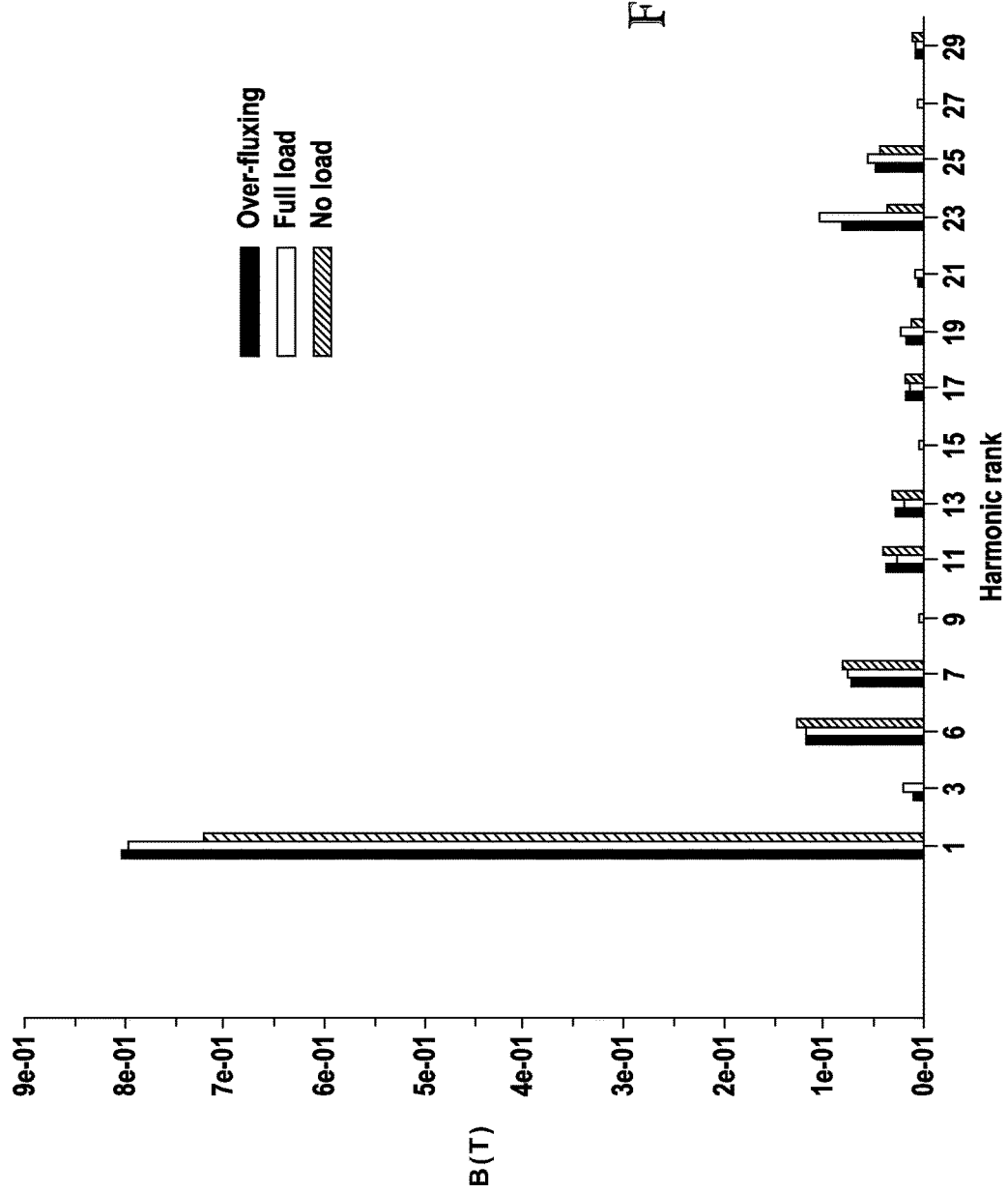
FIG. 9 is a spectral analysis.

FIG. 9 is a spectral analysis of the air gap flux density that confirms the similar behaviors of the flux density $B_{airgap}$ of a motor in an over-fluxing state and of a motor connected to a load with respect to the no-load situation. As can be seen on this figure, for lower space harmonics, the behavior is similar.

What is claimed is:

1. A method for determining core losses in a permanent magnet synchronous motor, the method comprising:
    obtaining, by at least one power analyzer, a measurement of the losses of the permanent magnet synchronous motor with the permanent magnet synchronous motor not connected to a load, and a deduction of the core losses of the permanent magnet synchronous motor from the losses of the permanent magnet synchronous motor; and
    utilizing a filter between the permanent magnet synchronous motor and an electric power supply to enable an over-fluxing state during the measurement of the losses of the permanent magnet synchronous motor, the filter being configured to supply reactive current to the permanent magnet synchronous motor.

2. The method according to claim 1, wherein the filter is a LC filter.

3. The method according to claim 1, the method further comprising:
    obtaining, by the at least one power analyzer, a direct component $I_{Overfluxing}$ of the current supplied to the permanent magnet synchronous motor for enabling the permanent magnet synchronous motor in the over-fluxing state using the following equation:

$$I_{Overfluxing} = \sqrt{I_{load}^2 + \frac{B_m^2}{k^2} - 2 \cdot \frac{I_{load} \cdot B_{max}}{k} \cdot \cos(\pi - \theta)}$$

with $I_{load}$ being a current associated with a load, $B_m$ the flux density due to the magnets of the motor, k a geometrical coefficient, $B_{max}$ the maximum flux density of the permanent magnet synchronous motor and θ a phase shift.

4. The method according to claim 1, wherein the deduction of the core losses comprises a determination, by the at least one power analyzer, of at least one type of losses among copper losses, time harmonic losses, active magnetic bearing losses, windage losses, and Litz copper losses.

5. A system for determining core losses in a permanent magnet synchronous motor, the system comprising:
    the permanent magnet synchronous motor;
    a measuring device for measuring the losses of the permanent magnet synchronous motor with the permanent magnet synchronous motor not connected to a load;
    a feature for deducting the core losses of the permanent magnet synchronous motor from the losses of the permanent magnet synchronous motor,
    a motor operating controller comprising a filter, the motor operating controller enabling the permanent magnet synchronous motor in an over-fluxing state during the measurement of the losses, the filter being configured to supply reactive current to the permanent magnet synchronous motor and being located between the permanent magnet synchronous motor and an electric power supply.

6. A system according to claim 5, wherein the filter is a LC filter.

7. A system according to claim 5, wherein a direct component $I_{Overfluxing}$ of the current supplied to the permanent magnet synchronous motor for placing the permanent magnet synchronous motor in the over-fluxing state by the measuring device using the following equation:

$$I_{Overfluxing} = \sqrt{I_{load}^2 + \frac{B_m^2}{k^2} - 2 \cdot \frac{I_{load} \cdot B_{max}}{k} \cdot \cos(\pi - \theta)}$$

with $I_{load}$ being a current associated with a load, $B_m$ the flux density due to the magnets of the motor, k a geometrical coefficient, $B_{max}$ the maximum flux density of the permanent magnet synchronous motor and θ a phase shift.

8. A system according to claim 5, wherein the measuring device for measuring the core losses of the motor comprises a feature for determining at least one type of losses among copper losses, time harmonic losses, active magnetic bearing losses, windage losses, and Litz copper losses.

* * * * *